(12) United States Patent
Von Emden et al.

(10) Patent No.: US 12,113,181 B2
(45) Date of Patent: Oct. 8, 2024

(54) BATTERY CELL WITH AN INTEGRATED CONTROL CIRCUIT

(71) Applicant: Robert Bosch GmbH, Stuttgart (DE)

(72) Inventors: Walter Von Emden, Eningen Unter Achalm (DE); Joachim Joos, Gerlingen (DE); Johannes Grabowski, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 730 days.

(21) Appl. No.: 17/270,360

(22) PCT Filed: Oct. 15, 2019

(86) PCT No.: PCT/EP2019/077833
§ 371 (c)(1),
(2) Date: Feb. 22, 2021

(87) PCT Pub. No.: WO2020/078935
PCT Pub. Date: Apr. 23, 2020

(65) Prior Publication Data
US 2021/0328272 A1    Oct. 21, 2021

(30) Foreign Application Priority Data
Oct. 15, 2018  (DE) .......................... 102018217572.1

(51) Int. Cl.
*H01M 10/42* (2006.01)
*H01M 10/44* (2006.01)
*H01M 10/48* (2006.01)

(52) U.S. Cl.
CPC ..... *H01M 10/4257* (2013.01); *H01M 10/443* (2013.01); *H01M 10/48* (2013.01); *H01M 10/486* (2013.01); *H01M 2010/4271* (2013.01)

(58) Field of Classification Search
CPC .......... H01M 10/4257; H01M 10/443; H01M 10/48; H01M 10/486; H01M 2010/4271;
(Continued)

(56) References Cited

U.S. PATENT DOCUMENTS 6,002,240 A * 12/1999 McMahan ............. H01M 10/48
429/7
6,084,271 A * 7/2000 Yu ....................... H01L 29/0649
257/351
(Continued)

FOREIGN PATENT DOCUMENTS

CN    105229882 A    1/2016
CN    108292847 A    7/2018
(Continued)

OTHER PUBLICATIONS

International Search Report for PCT/EP2019/077833, Issued Nov. 29, 2019.

*Primary Examiner* — Nha T Nguyen
(74) *Attorney, Agent, or Firm* — NORTON ROSE FULBRIGHT US LLP; Gerard A. Messina (57) ABSTRACT

A battery cell. The battery cell inclueded a first terminal contact and a second terminal contact, an energy storage unit, a first transistor, a sensor system that is set up to acquire a state parameter of the battery cell, and a control circuit. A first pole of the energy storage unit is coupled to the first terminal contact, and a second pole of the energy storage unit is coupled to the second terminal contact. The first transistor is connected between the first terminal contact and the second terminal contact in series with the energy storage unit. The he control circuit is set up to control a switching process of the first transistor, the control circuit controlling the first transistor based on the acquired state parameter in order to control a charge current or a discharge current of the energy storage unit.

8 Claims, 6 Drawing Sheets

(58) Field of Classification Search
CPC ... H01M 2200/00; H01M 10/44; Y02E 60/10; Y02T 10/70; H02J 7/0016; G01R 31/3842; G01R 31/396
See application file for complete search history.

(56) References Cited

U.S. PATENT DOCUMENTS

2015/0303442 A1  10/2015  Elian et al.
2020/0335835 A1* 10/2020  Song .................. H01M 10/482

FOREIGN PATENT DOCUMENTS

| DE | 102014202617 A1 | 8/2015 |
| DE | 102015002077 B3 | 6/2016 |
| DE | 102015002149 A1 | 8/2016 |
| DE | 102015215784 A1 | 2/2017 |

* cited by examiner

BATTERY CELL WITH AN INTEGRATED CONTROL CIRCUIT

FIELD

The present invention relates to a battery cell having an integrated control circuit.

BACKGROUND INFORMATION

In order to meet requirements in battery systems, often a design of parallel and series circuits of individual cells, for example lithium-ion cells, is necessary. In this context, it is conventional for a battery cell to include a control circuit in order to interrupt a flow of current in the battery cell.

Thus, German Patent Application No. DE 102015002149 A1 describes a battery cell having at least one switching element that is suitable for interrupting a flow of current through the battery cell when the battery cell is in a critical state. In addition, U.S. Patent Application Publication No. US 2015/0303442 A1 describes a battery cell having a control unit, in which an energy output of the battery cell can be interrupted by two switches situated in the battery cell.

SUMMARY

A battery cell according to an example embodiment of the present invention the present invention includes a first terminal contact, a second terminal contact, an energy storage unit, a first transistor, a sensor system that is set up to acquire a state parameter of the battery cell, and a control circuit, a first pole of the energy storage unit being coupled to the first terminal contact and a second pole of the energy storage unit being coupled to the second terminal contact, the first transistor being connected in series with the energy storage unit between the first terminal contact and the second terminal contact, and the control circuit being set up to control a switching process of the first transistor, the control circuit controlling the first transistor based on the acquired state parameter in order to control a charge current or a discharge current of the energy storage unit.

The first terminal contact and the second terminal contact are external terminal contacts of the battery cell that are in particular suitable for connecting the battery cell to other battery cells, for example in series or in parallel. The energy storage unit is in particular an electrochemical storage unit, for example a lithium-ion cell. The sensor system is a measurement device that is set up to measure the state parameter. For this purpose, the sensor system includes in particular a sensor. The control circuit is preferably an integrated circuit, for example an ASIC. The control circuit is in particular connected via a control line to the first transistor in order to switch it. The first pole of the energy storage unit is either a positive pole or a negative pole. The second pole of the energy storage unit is the respective other of the positive pole or of the negative pole.

The first transistor is connected in series with the energy storage unit, between the first terminal contact and the second terminal contact. This means that the first transistor is connected either between the energy storage unit and the first terminal contact or between the energy storage unit and the second terminal contact. The battery cell thus includes a power electronics switch, installed directly on the battery cell, as part of the individual battery cell.

The control circuit is set up to control a switching process of the first transistor, the control circuit controlling the transistor based on the acquired state parameter in order to control a charge current or a discharge current of the energy storage unit. The controlling of the charge current and discharge current here means that a current supplied to the energy storage unit, or a current taken from the energy storage unit, is dynamically controlled. This means that, through the switching process of the first transistor, the magnitude of a specified flow of current over a specified time can be controlled. A controlling is thus not limited to a mere switching on and off of a current, but rather defines a quantitative determination of the charge current or of the discharge current. The charge current and the discharge current can thus be set to particular magnitudes, and in this way charge currents having different strengths and/or discharge currents having different strengths can be set via the controlling. Preferably, the sensor system forms a control loop with the control circuit and the first transistor.

Thus, a targeted current controlling is created within the battery cell. This is based on a state parameter that was also acquired inside the battery cell. In this way, a self-sufficient controlling of the charge current or of the discharge current can take place via the battery cell, depending on the state in which the battery cell is, i.e., whether the battery cell is in a charge state or in a discharge state. Thus, a particularly compact system is created, and in particular a particularly accurate setting of a charge current and/or of a discharge current can take place, based on at least one locally acquired state parameter, due to the short measurement and control paths. Thus, an autonomously operating battery cell is created.

In order to meet requirements on battery systems in the future, a design of parallel and series connection of, e.g., lithium-ion individual cells is necessary. The possibility of controlling the current flow of individual battery cells, i.e., to connect or bridge individual battery cells, is advantageous with regard to many key factors relating to performance of the battery as a whole. This relates, e.g., to safety functions, the possibility of (clocked) fast charging of individual cells (depending on state of charge (SOC) and state of health (SOH)), and different loading in the operation of individual cells (in each case again a function of SOC and SOH).

A power module or design and connection technique design is created for the cost-optimized and space-optimized realization of the module at the cell level of a battery.

Preferred developments of the present invention are described herein.

Preferably, the sensor system includes at least one of: a voltage sensor, a current sensor, and a temperature sensor. Thus, the sensor system acquires either a voltage, a current, or a temperature in the battery cell. Preferably, the voltage sensor measures a voltage of the energy storage unit. The current sensor preferably measures the charge current or the discharge current of the energy storage unit. The temperature sensor preferably measures a temperature of the energy storage unit. For this purpose, the temperature sensor is preferably situated on the energy storage unit. Thus, a status of the battery cell can be acquired, because the sensor system acquires those parameters that accurately describe the state of the battery cell, and an advantageous charge current or discharge current can be controlled particularly precisely to the measurement values acquired by such a sensor system.

In accordance with an example embodiment of the present invention, it is also advantageous if the first transistor is a thin-film MOSFET transistor. This makes it possible to create a particularly compact battery cell. Here, the thin-film MOSFET transistor is particularly advantageous, because it can emit heat through its surface into a surrounding environment of the battery cell particularly quickly. Such a thin-film MOSFET can also be particularly advantageously situated on a surface of the battery cell. This is advantageous in particular if the battery cell is a prismatic cell, because such a prismatic cell typically has a surface that is sufficiently large to situate a thin-film MOSFET transistor thereon for controlling a charge current or discharge current. This is also in particular advantageous if the battery cell is a pouch cell, because a particularly flat construction of the battery cell can be achieved.

In addition, in accordance with an example embodiment of the present invention, it is advantageous if the battery cell additionally includes a second transistor that is connected between the first terminal contact and the second terminal contact, parallel to the energy storage unit, the control circuit being set up to control a switching process of the second transistor, and the second transistor in particular being a thin-film MOSFET transistor. The second transistor makes it possible to short-circuit the terminal contacts of the battery cell to one another if the first transistor receives a corresponding control signal from the control unit. In this way, the battery cell can be bridged, for example in order to be inactive in a series circuit of a plurality of battery cells without interrupting the series circuit. Simultaneously, through a corresponding switching of the second transistor by the control circuit, a targeted discharging of the energy storage unit with a desired discharge current can take place. The realization of the second transistor as a thin-film MOSFET transistor enables a particularly compact design of the battery cell. Here it is particularly advantageous if both the first transistor and the second transistor are realized as thin-film MOSFET transistors.

In accordance with an example embodiment of the present invention, it is also advantageous if the control circuit is set up to switch both the first transistor and the second transistor into a conductive state simultaneously. Here, a flow of current through the first transistor and/or through the second transistor can be controlled. In this way, it is enabled that the battery cell is heated, which is advantageous for example in order to control the energy storage unit to a working temperature or to a preferred temperature for a balancing. Here it is in particular advantageous if the state parameter is a temperature and the sensor system includes a temperature sensor. An autonomously operating temperature controlling can thus take place in the battery cell.

In addition, in accordance with an example embodiment of the present invention, it is advantageous if the control circuit is set up to control the switching process of the first transistor for the controlling of the charge current or of the discharge current through a pulsed switching of the transistor, or through an operation of the first transistor in a resistance operating mode. In this way, the first transistor and/or the second transistor are controlled by a pulse-width-modulated signal in order to switch the transistor in a pulsed fashion. By setting the pulse width or frequency via the control circuit, the charge current and/or the discharge current can be controlled. This is particularly advantageous because it enables a particularly fast charging of the energy storage unit, in which the battery cell is not unnecessarily heated because the first transistor is not operating as a resistor. If the first transistor is operated in a resistance operating mode, then this is likewise advantageous, because the charge current and the discharge current can be set particularly accurately in an analogous manner.

In addition, in accordance with an example embodiment of the present invention, it is advantageous if the control circuit is set up to control the switching process of the first transistor for controlling the charge current or the discharge current in such a way that a cell balancing is carried out. Here, the first state parameter is preferably a voltage of the energy storage unit and the voltage of the energy storage unit is set by controlling the discharge current and the charge current to a target value. Further preferably, the cell balancing is carried out based on measurement values that describe a state of adjacent battery cells. Here, from the state parameter a state of adjacent battery cells is preferably inferred. Thus, through the state parameter, in particular a voltage prevailing in the battery cell or a current flowing through the battery cell that is provided by adjacent battery cells is measured. Alternatively, the control unit is provided with an item of information about a charge state of adjacent battery cells, via an additional interface. In this way, a cell balancing can take place without a central control unit for controlling the charge current and the discharge current in the battery cells of the battery. A particularly error-resistant system is created.

In accordance with an example embodiment of the present invention, it is also advantageous if the control circuit is set up to ascertain a charge state of the energy storage unit, a state of aging of the energy storage unit, and/or a functional state of the energy storage unit. Here, the charge state, the state of aging, and/or the functional state are ascertained based on the state parameter. In this way, a particularly informative basis is created that enables an advantageous controlling of the charge current and/or the discharge current, in particular during a cell balancing.

Preferably, the first transistor is situated on an external surface of the energy storage unit, a first contact surface of the first transistor lying on the second pole of the energy storage unit, a plate-shaped conductor lying on a second contact surface of the first transistor that is oriented away from the external surface of the energy storage unit, and the plate-shaped conductor being electrically connected to the second terminal contact. The first contact surface of the first transistor and the second contact surface of the first transistor are those surfaces of the first transistor between which a contact is switched by a switching of the transistor. A plate-shaped conductor is a conductor that has at least one flat surface. In the simplest case, this means that the plate-shaped conductor is not round, and lies on the first transistor with a flat surface. In this way, a large-surface contact surface is created between the contact surface of the first transistor and the pole of the energy storage unit. At the same time, a particularly compact construction of the battery cell is enabled, and a flow of current with low resistance is enabled. In addition, in the battery cell an efficient temperature compensation can take place via the contact surfaces in order to avoid an overheating of the first transistor and of the energy storage unit.

In accordance with an example embodiment of the present invention, it is advantageous if a further transistor is situated on the external surface of the energy storage unit, a first contact surface of the further transistor lying on the first pole of the energy storage unit, and the plate-shaped conductor further lying on a second contact surface of the further transistor that is oriented away from the external surface of the energy storage unit. The further transistor is preferably the second transistor. In this way, it is enabled that both the first transistor and the further transistor are contacted via a single common element, here the plate-shaped conductor. In this way, a particularly simple construction of the battery cell is created.

It is to be noted that both the switching of the first transistor and the switching of the second transistor by the control circuit preferably takes place based on the acquired state parameter of the battery cell. However, this does not exclude that, in addition to the state parameter of the battery cell, further parameters may be used, for example parameters that are provided to the control circuit by a communication interface.

BRIEF DESCRIPTION OF THE DRAWINGS

Below, exemplary embodiments of the present invention are described in detail with reference to the figures.

DETAILED DESCRIPTION OF EXAMPLE EMBODIMENTS

Figure 1:
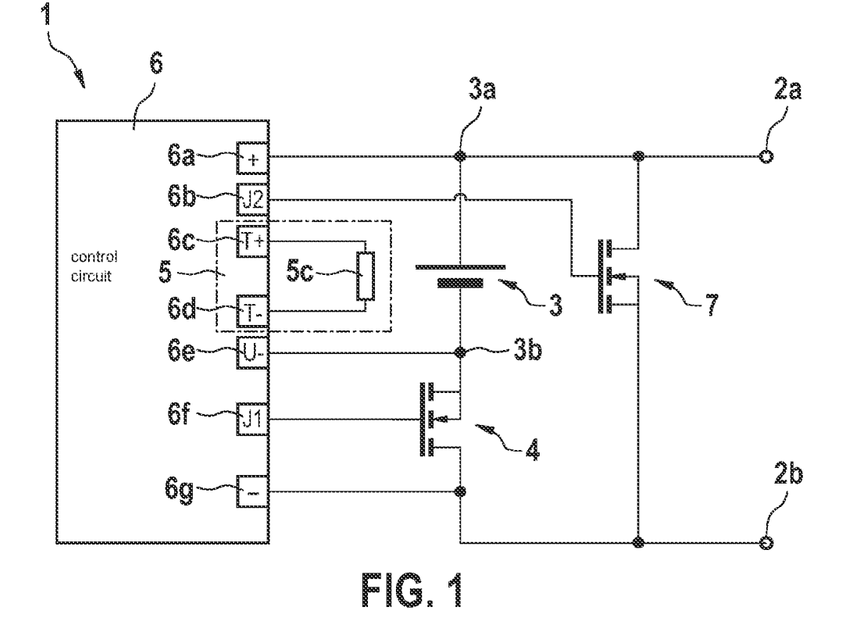
FIG. 1 shows a circuit diagram of a battery cell according to a first specific embodiment of the present invention.

FIG. 1 shows a circuit diagram of a battery cell 1 according to a first specific embodiment of the present invention. Battery cell 1 includes a first terminal contact 2a and a second terminal contact 2b. The two terminal contacts 2a, 2b make it possible to connect a consumer to battery cell 1, or to connect further batteries or battery cells to battery cell 1, in series or in parallel.

Battery cell 1 has an energy storage unit 3. Energy storage unit 3 is an electrochemical energy storage unit; in this first specific embodiment of the present invention, energy storage unit 3 is preferably a lithium-ion cell. Energy storage unit 3 has a first pole 3a and a second pole 3b. Here, first pole 3a is a plus pole and second pole 3b is a minus pole. However, it is to be noted that in alternative specific embodiments first pole 3a is a minus pole and second pole 3b is a plus pole. First pole 3a of energy storage unit 3 is connected to first terminal contact 2a.

In addition, battery cell 1 includes a first transistor 4. First transistor 4 is a thin-film MOSFET transistor. First transistor 4 has a first switching contact and a second switching contact, the first switching contact being connected to second pole 3b of energy storage unit 3 and the second switching contact being connected to second terminal contact 2b. The first switching contact is a source contact of the transistor. The second switching contact is a drain contact of first transistor 4. In addition, first transistor 4 has a control contact; in this first specific embodiment of the present invention, the control contact is a gate contact.

Battery cell 1 further includes a control circuit 6 that is an ASIC. Control circuit 6 is thus an integrated circuit. Control circuit 6 has a first terminal 6a, a second terminal 6b, a third terminal 6c, a fourth terminal 6d, a fifth terminal 6e, a sixth terminal 6f and a seventh terminal 6g. Via the first through seventh terminals, input signals can be provided to control circuit 6, and control circuit 6 can output output signals.

Battery cell 1 has in addition a second transistor 7. Second transistor 7 is a thin-film MOSFET transistor. Second transistor 7 is connected between the first terminal contact and second terminal contact 2b, in parallel to energy storage unit 3. For this purpose, a first switching contact of second transistor 7, here a drain contact, is connected to first terminal contact 2a. A second switching contact of second transistor 7, here a source contact, is connected to second terminal contact 2b.

Thus, a first pole 3a of energy storage unit 3 is coupled to first terminal contact 2a. In this specific embodiment, first pole 3a of energy storage unit 3 is connected directly to first terminal contact 2a. Second pole 3b of the energy storage unit is coupled to second terminal contact 2b. Second pole 3b of energy storage unit 3 is coupled to second terminal contact 2b via first transistor 4. First transistor 4 is connected between first terminal contact 2a and second terminal contact 2b, in series with energy storage unit 3. There thus results a series circuit of first transistor 4 and energy storage unit 3.

The control contacts of first transistor 4 and of second transistor 7 are connected to control circuit 6. Here, the control input of first transistor 4 is connected to sixth terminal 6f of control circuit 6. The control input of second transistor 7 is connected to second terminal 6b of control circuit 6. Control circuit 6 is set up to control a switching process of first transistor 4 and a switching process of second transistor 7. This takes place in that, through control circuit 6, a corresponding signal is applied to second terminal 6b in order to switch second transistor 7, or that, through control circuit 6, a corresponding signal is applied to sixth terminal 6f in order to switch first transistor 7.

Battery cell 1 further includes a sensor system 5 that is set up to acquire a state parameter of battery cell 1. In this first specific embodiment, sensor system 5 includes a voltage sensor 5a, a current sensor 5b, and a temperature sensor 5c. In other specific embodiments of the present invention, sensor system 5 includes only a selection of the sensors named here. In this first specific embodiment, temperature sensor 5c is situated in the immediate vicinity of energy storage unit 3 in order to acquire a temperature of energy storage unit 3. Temperature sensor 5c is connected to third terminal 6c with a terminal contact, and is connected with a further terminal contact to fourth terminal 6d of control circuit 6. The remaining components of sensor system 5 are situated in control circuit 6. For this purpose, first terminal 6a of control circuit 6 is connected to first terminal contact 2a and to first pole 3a of energy storage unit 3. In addition, seventh terminal 6g is connected to second terminal contact 2b, and thus to the second switching contact of first transistor 4. In addition, fifth terminal 6e is connected to second pole 3b of energy storage unit 3, and is thus connected to the first switching contact of first transistor 4.

Control circuit 6 is set up to control a switching process of first transistor 4; here control circuit 6 controls transistor 4 based on the acquired state parameter in order to control a charge current or a discharge current of energy storage unit 4. This means that a flow of current to energy storage unit 4 or from energy storage unit 4 is controlled. Here a magnitude of the current flow can be set. This magnitude can be dynamically adjusted, and can be set to different values. Control circuit 6 is thus not limited to simply switching a flow of current from or to energy storage unit 3 on and off; rather, additional values for a magnitude of the flowing current can be set. For this purpose, a controlling algorithm is integrated in control circuit 6. Sensor system 5, control circuit 6, and first transistor 4 thus together form a control loop.

Figure 3:
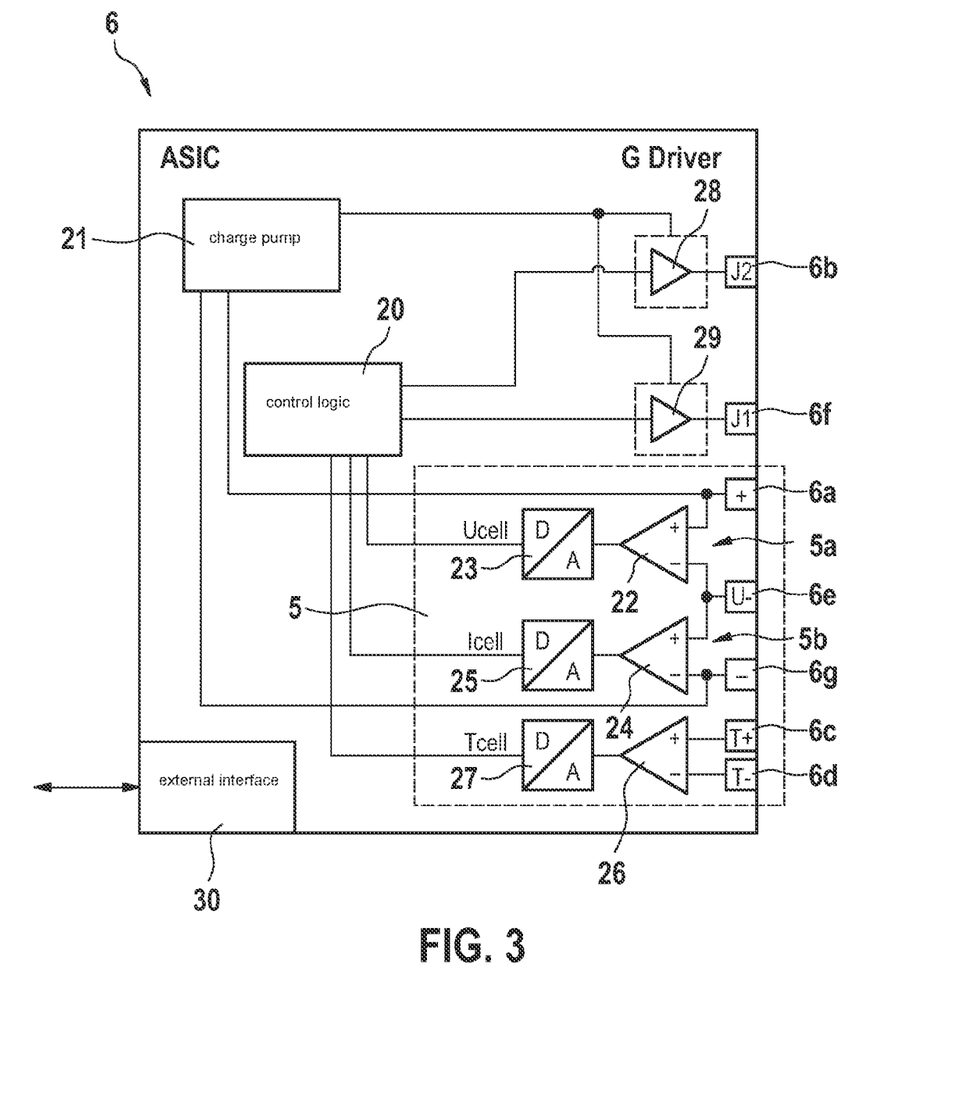
FIG. 3 shows a circuit diagram of an exemplary control circuit according to a specific embodiment of the present invention.

FIG. 3 shows a circuit diagram of control circuit 6 according to the first specific embodiment of the present invention. Control circuit 6 includes a control logic unit 20. Control logic unit 20 is set up to output control signals to second terminal 6b and to sixth terminal 6f in order to control first transistor 4 and second transistor 7. For this purpose, control logic 20 is coupled to second terminal 6b via a first operational amplifier 28, and is coupled to sixth terminal 6f via a second operational amplifier 29. Operational amplifiers 28, 29 of control circuit 6, and also control logic 20, are supplied with a supply voltage by a charge pump 21. Charge pump 21 is supplied, via first terminal 6a and via seventh terminal 6g, with a voltage that is provided by energy storage unit 3 and/or by further battery cells connected in series that are connected to first terminal contact 2a and to second terminal contact 2b of the battery cell 1.

Sensor system 5 communicates to control logic 20 a plurality of state parameters that are acquired by sensor system 5.

Sensor system 5 includes voltage sensor 5a. Voltage sensor 5a includes a first comparator 22 that is coupled, with a first input terminal, to first terminal 6a of control circuit 6, and is coupled with a second input terminal to fifth terminal 6e of control circuit 6. Thus, first comparator 22 acquires a voltage drop over energy storage unit 3. An output terminal of first comparator 22 is coupled to an input of a first analog-digital converter 23. This first analog-digital converter 23 converts the voltage drop into a digital signal. This digital signal describes the voltage at energy storage unit 3, which is a state parameter of battery cell 1. An output terminal of first analog-digital converter 23 is coupled to an input of control logic 20. The digital output signal of first analog-digital converter 23 is transmitted to control logic 20. Thus, control logic 20 has knowledge of the voltage drop present over energy storage unit 3.

In addition, sensor system 5 includes current sensor 5b. Current sensor 5b includes a second comparator 24 that is coupled, with a first input terminal, to the fifth terminal 6e of control circuit 6, and, with a second input terminal, is connected to seventh terminal 6f of control circuit 6. Second comparator 24 thus acquires a voltage drop over first transistor 4. An output terminal of second comparator 24 is coupled to an input of a second analog-digital converter 25. This second analog-digital converter 25 converts the voltage drop into a digital signal. This digital signal describes the voltage over first transistor 4. An output terminal of second analog-digital converter 25 is coupled to an input of control logic 20. The digital output signal of second analog-digital converter 25 is transmitted to control logic 20. Because first transistor 4 is controlled by control logic 20, control logic 20 additionally has knowledge of a respectively present resistance value of first transistor 4. Based on the resistance value of first transistor 4, and on the digital signal provided by second analog-digital converter 25, control logic 20 ascertains the current flowing through battery cell 1.

In addition, sensor system 5 includes temperature sensor 5c. Temperature sensor 5c is connected to third terminal 6c and to fourth terminal 6d of control circuit 6. In control circuit 6, a third comparator 26 is connected with a first input terminal to third terminal 6c, and is connected with a second input terminal to fourth terminal 6d of control circuit 6. A voltage drop over temperature sensor 5c describes a temperature of energy storage unit 3. An output of third comparator 26 is coupled to an input of a third analog-digital converter 27. This third analog-digital converter 27 converts the voltage, which describes the temperature, into a digital signal. An output terminal of third analog-digital converter 27 is coupled to an input of control logic 20. The digital output signal of third analog-digital converter 27 is transmitted to control logic 20. Control logic 20 converts the digital signal into a temperature value.

Control logic 20, and thus control circuit 6, are thus provided with measurement values for the current flowing to or from energy storage unit 3, the voltage present over energy storage unit 3, and the temperature of energy storage unit 3, as input variables.

Optionally, control circuit 6 includes an external interface 30 that is coupled with adjacent battery cells 1 or with a battery management system, and that is suitable to receive control signals and/or to send measurement values. Thus, individual actions of control circuit 6, in particular a cell balancing, can be triggered via external interface 30.

Through control circuit 6, a switching process of first transistor 4 is controlled in such a way that, based on the acquired state parameter, a charge current or a discharge current of energy storage unit 4 is controlled. Here, whether the flowing current is a charge current or a discharge current of energy storage unit 4 is a function of which voltage is present at first terminal contact 2a and second terminal contact 2b.

First transistor 4 is either controlled by a pulse-width-modulated signal or is operated in a resistance operating mode.

If first transistor 4 is controlled by the pulse-width-modulated signal, then first transistor 4 is alternately switched into an open and a closed state, i.e., a high-ohmic and a low-ohmic state. In this way a flow of current through energy storage unit 4 can be controlled as a function of a pulse width and/or frequency of the pulse-width-modulated signal that is provided at sixth terminal 6f of control circuit 6 by control logic 20.

Alternatively, first transistor 4 is operated in the resistance operating mode. This means that first transistor 3 is used as a controllable resistor. This takes place in that, via sixth terminal 6f of control circuit 6, an analog signal is applied to the control input of first transistor 4 by control logic 20.

In different specific embodiments, control circuit 6 is either set up to output only a pulsed signal to first transistor 4, to output only an analog control signal to first transistor 4, or optionally to output a pulsed signal or an analog control signal to first transistor 4.

In the design of the specific embodiment described in FIGS. 1 and 3, battery cell 1 includes an energy storage unit 3, a series switch (first transistor 4, e.g., MOSFET), and a parallel, or short-circuit, switch (second transistor 7, e.g., MOSFET), an ASIC, sensors (for example a temperature sensor) and an (optional) external interface of the ASIC. Despite the integration of switches, sensor system, and logic system, the individual battery cell acts, outwardly, again as a (now active) two-pole device, and can be installed for example in battery blocks and modules for increasing power or voltage. The installed MOSFETs are preferably low-voltage NMOS transistors, but can also be realized by PMOS or bipolar components. In addition, the series MOSFET can be connected in series to the plus or minus pole of the battery.

Temperature sensor 5c is installed close to energy storage unit 3, in order to acquire the current temperature. The ASIC takes its current supply directly from the connected battery, provides gate signals (gate drivers) for the MOSFETs, monitors, via A/D channels, cell temperature and cell voltage, as well as the cell current, on the basis of the proportional voltage drop at the series transistor (first transistor 4) given the known resistance of the fully open first transistor 4. Via an (optional) interface, the ASIC can obtain control signals and issue state notifications. The interface can take place either via additional control lines or via modulation of control commands onto the cell terminals, i.e., via terminal contacts 2a, 2b. In addition, each ASIC can contain non-volatile information about the respective battery cell (status, position, error flag, . . . ).

Figure 2:
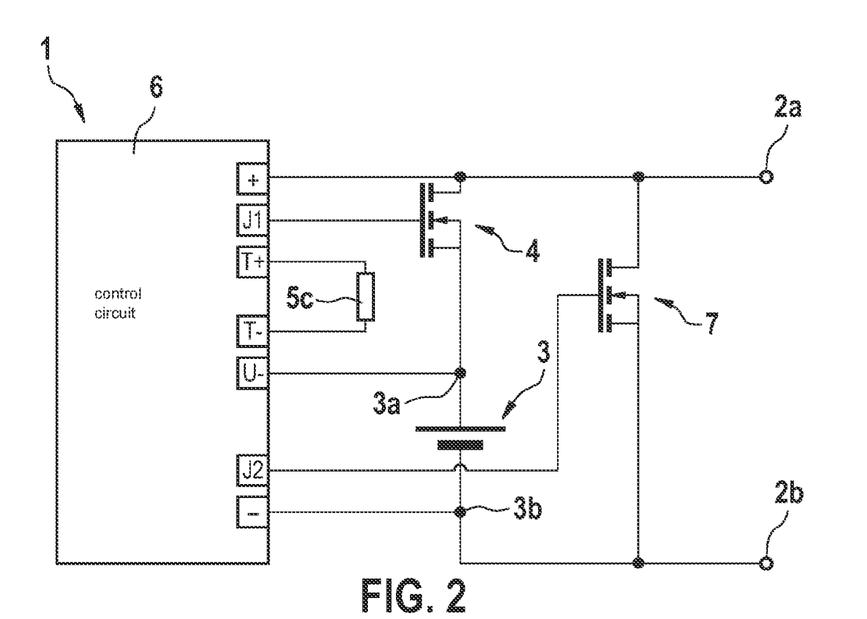
FIG. 2 shows a circuit diagram of a battery cell according to a second specific embodiment of the present invention.

FIG. 2 shows a battery cell 1 according to a second specific embodiment of the present invention. The second specific embodiment of the present invention corresponds to the first specific embodiment of the present invention, the first transistor 4 being connected to first terminal contact 2a and energy storage unit 3 being connected to second terminal contact 2b. Energy storage unit 3 and first transistor 4 are thus further connected in series, their position being exchanged in comparison with the first specific embodiment of the present invention.

The function of the integrated intelligent battery switch created with battery cell 1 relates to a multiplicity of areas of use of battery cell 1, such as optimized charging, discharging (operation), ensuring operation at an optimal operating point, diagnosis of SOC, SOH, and SOF, safety functions, and the provision of a safe state during maintenance work. For this purpose, the charge current and/or discharge current of energy storage unit 4 are controlled in a corresponding manner based on the state parameter of battery cell 1. Here, the controlling of first transistor 4 can take place in a different manner and for different purposes. Advantageous examples for the controlling of first transistor 4 are described in detail in the following, in particular with reference to FIGS. 4, 5, 6, 7, 8, and 9.

Figure 4:
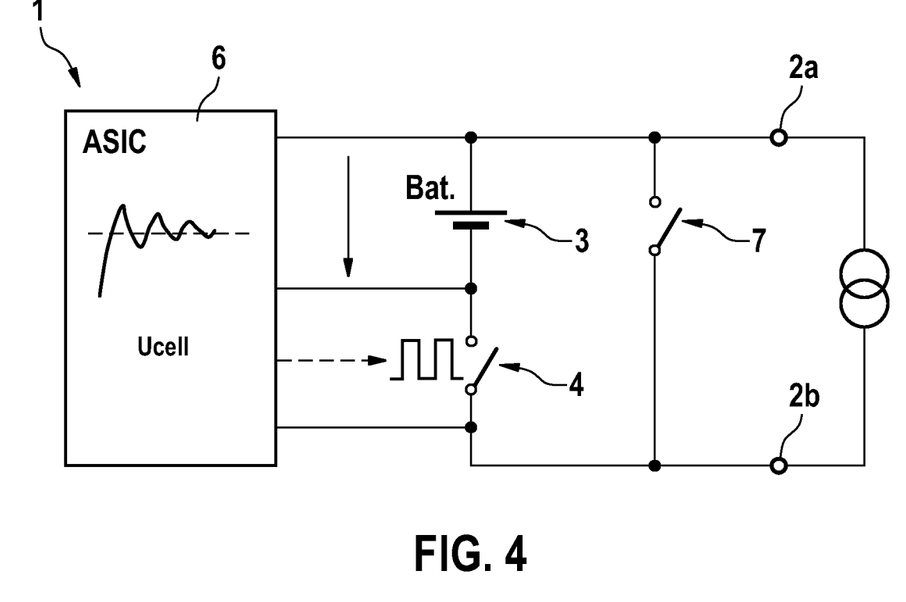
FIG. 4 shows a battery cell according to a specific embodiment of the present invention, in an exemplary first operating mode.

FIG. 4 shows an example of a first operating mode of battery cell 1. The first operating mode is a charge controlling, in which a charge current of energy storage unit 4 is controlled by first transistor 4, and the corresponding controlling is controlled by control circuit 6. In control circuit 6, in particular in control logic 20, a target voltage value is stored that describes an output voltage of energy storage unit 3 in a charged state. The actual output voltage of energy storage unit 3 is acquired by sensor system 5. There now takes place a pulsed charging of energy storage unit 3, in which first transistor 4 is alternately switched into a high-ohmic and into a low-ohmic state by the pulse-width-modulated signal. If first transistor 4 is switched to a high-ohmic resistance, then sensor system 5 acquires the output voltage of energy storage unit 3. If this voltage is below the target value, then the charging process is continued, i.e., the pulse-width-modulated signal continues to be applied to first transistor 4. This takes place until energy storage unit 3 outputs the output voltage indicated as target value, and this is acquired by sensor system 5. In the first mode, second transistor 7 is switched into a high-ohmic state; this means that the switch formed by second transistor 7 is open.

FIG. 4 thus shows the use of first transistor 4 as a switch during a pulsed charging operation. Here, the battery voltage (and, if appropriate, the battery internal resistance) is monitored, and the charge current is switched in pulsed fashion via first transistor 4 to energy storage unit 3. It is advantageous that in this operating mode a faster charging is enabled. In addition, it is ensured that the (single) energy storage unit 3 is not overcharged.

Figure 5:
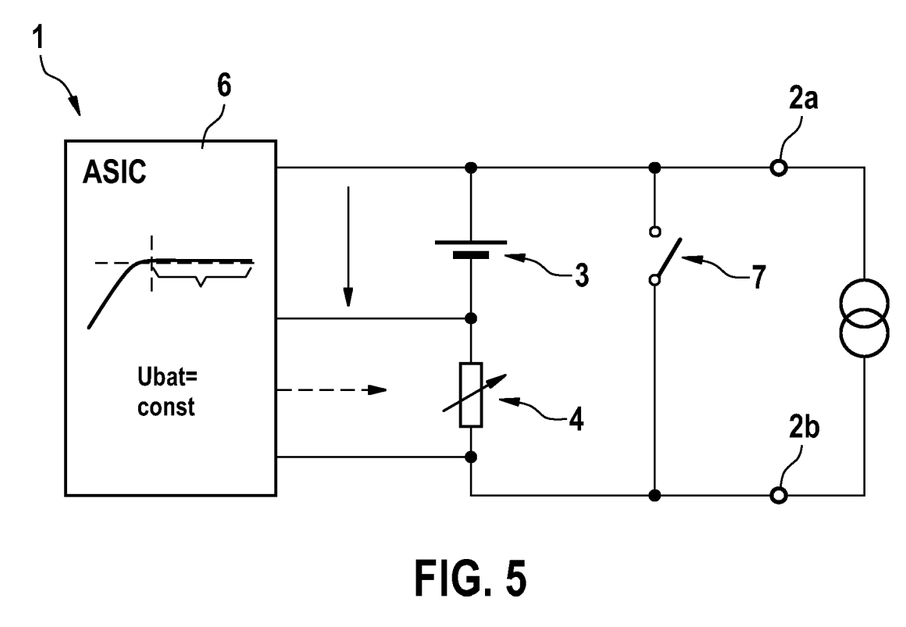
FIG. 5 shows the battery cell according to a specific embodiment of the present invention in an exemplary second operating mode.

Using first transistor 4, in addition for this reason a voltage limitation can be realized at the cell level, in which first transistor 4 is operated in resistance operating mode. This is shown in FIG. 5. FIG. 5 describes a second operating mode that is a charge mode of battery cell 1. The second operating mode corresponds substantially to the first operating mode, in which the first transistor is operated in resistance operation, i.e., a resistance value provided by first transistor 4 is set such that the acquired voltage over energy storage unit 3 approaches a target value.

Both the first operating mode and the second operating mode can be used for an active cell balancing. Here, energy storage unit 3 is either charged or discharged by the pulsed closing of first transistor 4 or the controlling of first transistor 4 to a particular resistance value. If the voltage of energy storage unit 3 has reached a specified target value, then first transistor 4 is switched into a high-ohmic state, and second transistor 7 is switched into a low-ohmic state in order to bridge energy storage unit 3. This makes it possible for battery cells adjacent to battery cell 1 to continue the cell balancing. See FIG. 6 in this regard.

Likewise advantageous is the use of the battery cell in charging operation for (active) balancing. Because the individual cells of a battery in the application are connected to form blocks (e.g., a series circuit in order to increase the voltage), the individual battery cells are generally not individually accessible for the charging electronics. However, using battery cell 1 it is possible to monitor the charge state and the (maximum permitted) final voltage. Using first transistor 4, already fully charged battery cells can be coupled out of the series circuit. Here, second transistor 7 ensures the bridging/maintenance of the remaining series circuit. This is further shown in FIG. 6.

Figure 6:
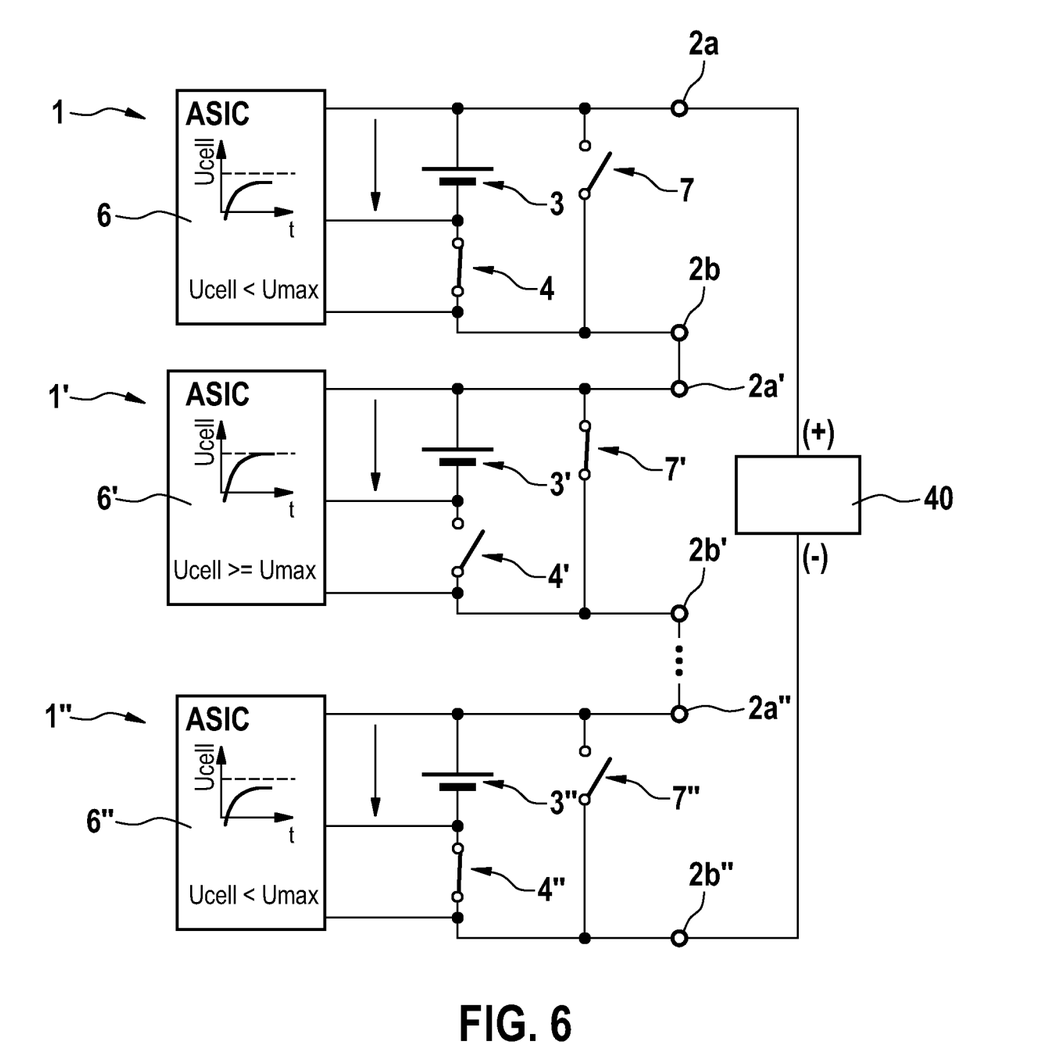
FIG. 6 shows a series circuit of a plurality of battery cells according to a specific embodiment of the present invention.

FIG. 6 shows an exemplary battery that includes a series circuit of three battery cells, in which each of the battery cells is one of the battery cells 1 according to the present invention. Thus, battery cell 1 shown in FIG. 6 includes a first battery cell 1, a second battery cell 1', and a third battery cell 1".

A charge device 40 is connected to the battery, which charge device provides a direct voltage as charge voltage. In each of the battery cells 1, 1', 1" of the battery, the respective sensor system 5, 5', 5" of battery cell 1, 1', 1" acquires a voltage drop over the associated energy storage unit 3, 3', 3" and the respective first transistor 4, 4', 4" is correspondingly switched in order to control an output voltage Ucell of energy storage unit 3 to a specified target value Umax.

Thus, in the state shown in FIG. 6, an output voltage of energy storage unit 3 of first battery cell 1 and the output voltage of energy storage unit 3" of third battery cell 1" are lower than the target value Umax.

The first transistor 4, 4" of the respective battery cell 1, 1" is therefore in a low-ohmic state. Energy storage unit 3' of second battery cell 1' has already reached the target value Umax. Therefore, first transistor 4' of second battery cell 1' is switched into a high-ohmic state. Second transistor 7' of second battery cell 1" is switched into a low-ohmic state in order to bridge second battery cell 1'. Second transistor 7' of first and third battery cell 1, 1" is switched into a high-ohmic state in order to enable a further charging of energy storage unit 3, 3" of first and of third battery cell 1, 1'.

Control circuit 6 is thus set up to control the switching process of first transistor 3 for controlling the charge current or the discharge current in such a way that a cell balancing is carried out.

Figure 7:
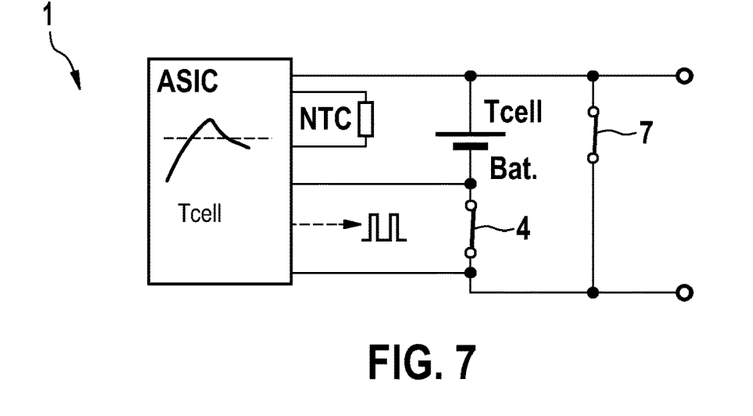
FIG. 7 shows the battery cell according to a specific embodiment of the present invention in an exemplary third operating mode.

FIG. 7 shows a third exemplary operating mode of battery cell 1. In the third operating mode, both first transistor 4 and second transistor 7 are switched into a low-ohmic state. First transistor 4 is here either controlled by the pulse-width-modulated signal or is operated in resistance mode. Battery cell 1, in particular energy storage unit 3, heats up when there is such a switching of first transistor 4 and of second transistor 7, because energy storage unit 3 is discharged via first transistor 4 and second transistor 7. Because the temperature of energy storage unit 3 is acquired by sensor system 5, a controlling by control circuit 6 takes place. Here, the current temperature, acquired by sensor system 5, of energy storage unit 3 is compared to a comparison value, and first transistor 4 is correspondingly switched into a low-ohmic state until energy storage unit 3 has reached the temperature target value.

Alternatively, in the third operating mode first transistor 3 and second transistor 7 are simultaneously switched into a low-ohmic state in order to discharge energy storage unit 3 in a targeted manner. In such an embodiment of the third operating mode, energy storage unit 3 can for example be discharged into a safe operating state if for example external damage to battery cell 1 has been detected, which is done either by sensor system 5 or is provided by external interface 30 as a control command to battery cell 1.

FIG. 7 thus shows a possibility in which both transistors 4, 7 are (at times) closed. This short-circuit operation can be used to "preheat" energy storage unit 3 through losses at the internal resistance and the MOSFETs thermally coupled to energy storage unit 3, and to bring the unit to an optimal operating temperature. In addition, this operating mode can be used to bring about a "fast discharging" of the cell, e.g., when there is external damage and the risk of a thermally instable state, and to bring it into a safe state.

Figure 8:
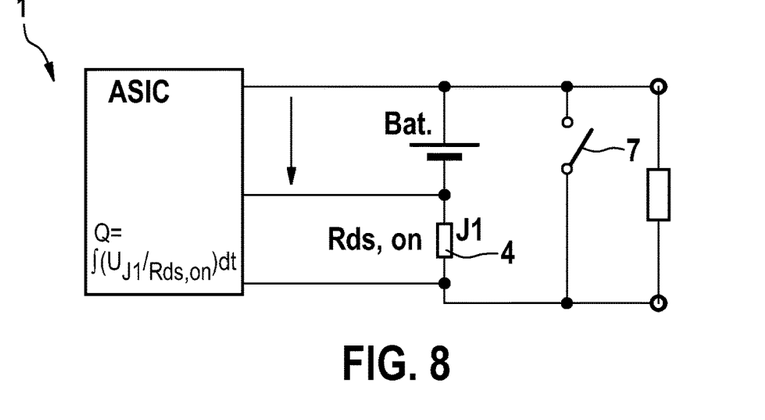
FIG. 8 shows the battery cell according to a specific embodiment of the present invention in an exemplary fourth operating mode.

FIG. 8 shows a fourth operating mode of battery cell 1. In the fourth operating mode, a charge state of energy storage unit 3, a state of aging of energy storage unit 3, and/or a functional state of energy storage unit 3 are ascertained. This preferably takes place in a service mode that is triggered by external interface 30. In the service mode, a predefined load is connected to the battery associated with battery cell 1. First transistor 4 is controlled to a specified resistance value. Energy storage unit 3 thus discharges via first transistor 4, the resistance value of first transistor 4 being known to control circuit 6. At the same time, the output voltage of energy storage unit 3 is known to control circuit 6 through sensor system 5. From these values it is ascertained what charge is emitted by energy storage unit 3 over a predefined time period. From these values, the current state of charge of the energy storage unit, its state of aging, and its functional state are ascertained. These values are preferably stored in control circuit 6 and are used for a later controlling of the charge current or of the discharge current of energy storage unit 4. Alternatively or in addition, the values ascertained in this way regarding the state of charge of the energy storage unit, the state of aging of energy storage unit 3, and/or the functional state of energy storage unit 3 are communicated to a battery management system via external interface 30. In the fourth operating mode, second transistor 7 is in a high-ohmic state, and the switch formed by second transistor 7 is thus open.

FIG. 8 thus shows the operation of battery cell 1 for ascertaining the SOC as a Coulomb counter, in which the discharge current (determined indirectly via first transistor 4) is integrated.

Figure 9:
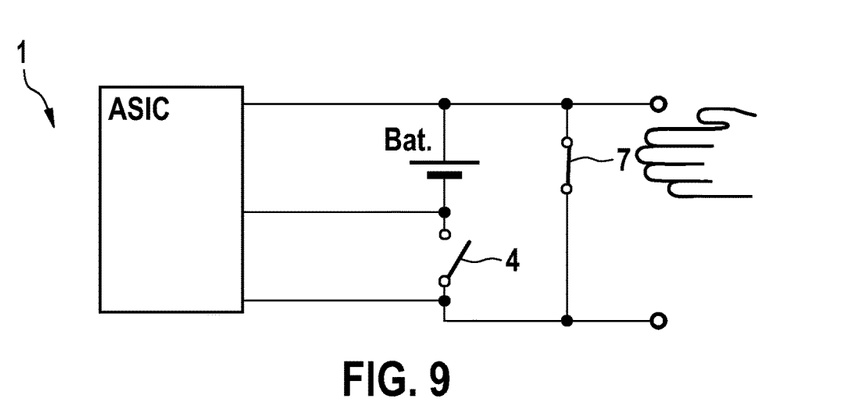
FIG. 9 shows the battery cell according to a specific embodiment of the present invention in an exemplary fifth operating mode.

FIG. 9 shows a fifth operating mode of battery cell 1. This operating mode can also be designated maintenance mode. In maintenance mode, only second transistor 4 is switched into a low-ohmic state, and first transistor 4 is switched into a high-ohmic state. Energy storage unit 3 is thus bridged. The maintenance mode can either be triggered via external interface 30 or can be triggered when battery cell 1, i.e., the control circuit 6 of battery cell 1, determines that the charge state of energy storage unit 3, the state of aging of the energy storage unit, and/or the functional state of energy storage unit 3 no longer permits regular operation of battery cell 1. This has, inter alia, the advantage that battery cell 1 can safely be touched during maintenance to terminal contacts 2a, 2b, and that battery cell 1 is excluded from a series or parallel circuit of a plurality of battery cells, in order to prevent further damage to energy storage unit 3 or thermal runaway of battery cell 1.

In the maintenance mode, a freedom from voltage of battery cell 1 and thus of the battery can in this way be ensured, by decontacting all battery cells. In addition, particularly weak blocks, down to individual cells, can be exchanged; as a rule these are the battery cells having the lowest SOH, so that the lifespan of the overall battery can be correspondingly prolonged.

Further possible uses of the battery switch in charge-discharge operation for diagnosis and exchange are possible and are not limited to the functions stated above.

Figure 10:
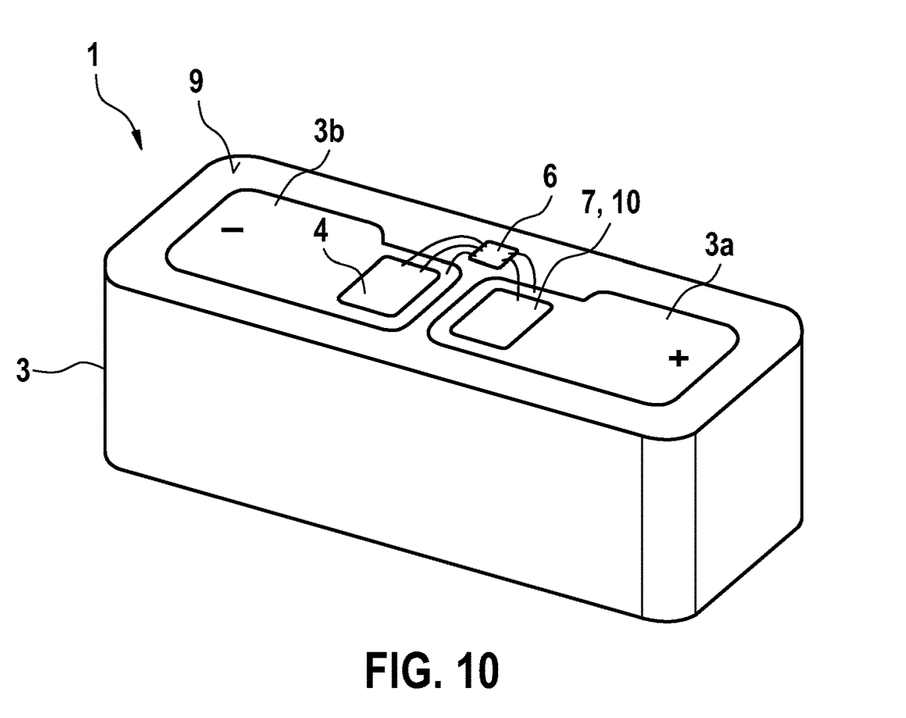
FIG. 10 shows a battery cell according to the present invention in a first view.

FIG. 10 describes an advantageous design of battery cell 1. Here, battery cell 1 is a prismatic battery cell. Energy storage unit 3 here is a unit that has at least one external surface 9 that includes a first region that forms first pole 3a and a second region that forms second pole 3b. On first pole 3a there is situated a further transistor 10 that is second transistor 7. First transistor 4 is situated on second pole 3b. First transistor 4 and second transistor 7 lie flatly on the respective pole 3a, 3b. First transistor 4 is thus situated on an external surface 9 of energy storage unit 3.

A first contact surface of first transistor 4 lies on second pole 3b of the energy storage unit. Here, the first contact surface of first transistor 4 forms the first switching contact of first transistor 4. Correspondingly, second transistor 7 lies on first pole 3a of energy storage unit 3. Here, second transistor 7 is situated on external surface 9 of energy storage unit 3 in such a way that a first contact surface of second transistor 7 lies on first pole 3a of energy storage unit 3. The first contact surface of second transistor 7 corresponds to the first switching contact.

Given a corresponding connecting through of first transistor 4 or of second transistor 7, the voltage provided by energy storage unit 3 to the surface (at top in FIG. 10) of first transistor 4 and of second transistor 7 can thus be provided. Control circuit 6 is situated on the same surface 9, situated at the top, of energy storage unit 3. Here, corresponding to the specific embodiments shown in FIG. 1 and FIG. 2, control circuit 6 is coupled to first transistor 4, to second transistor 7, to first pole 3a and to second pole 3b.

Figure 11:
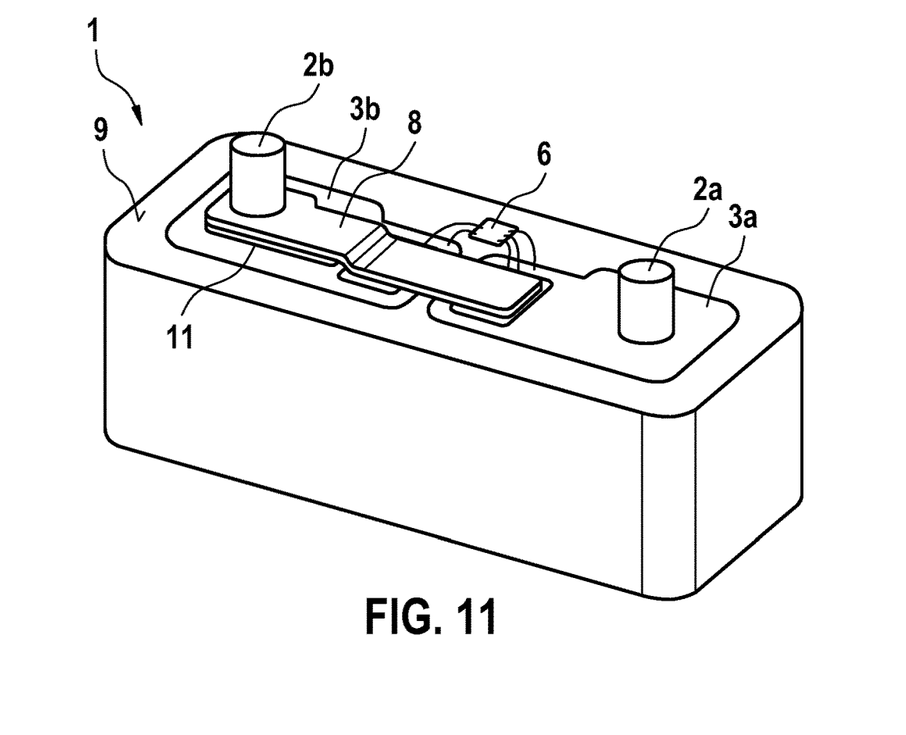
FIG. 11 shows the battery cell according to the present invention in a second view.

FIG. 11 shows battery cell 1 from FIG. 10 in a state ready for operation. Here, first terminal contact 2a is situated on first pole 3a, first pole 3a being electrically conductively connected to first terminal contact 2a. This first terminal contact 2a makes it possible to contact battery cell 1. A plate-shaped conductor 8 is situated on first transistor 4 and on second transistor 7. Plate-shaped conductor 8 lies on a second contact surface of first transistor 4 that is oriented away from external surface 9 of energy storage unit 3. Here, second contact surface of first transistor 4 forms the second switching contact of first transistor 4. Plate-shaped conductor 8 further lies on a second contact surface of second transistor 7 that is oriented away from external surface 9 of energy storage unit 3. Here, the second contact surface of first transistor 4 forms the second switching contact of second transistor 7. There is thus an electrical connection between plate-shaped conductor 8 and first pole 3a via second transistor 7, when this transistor is switched into a low-ohmic state.

Plate-shaped conductor 8 is insulated from second pole 3b by an intermediate insulating element 11. However, an electrical connection between plate-shaped conductor 8 and second pole 3b can be produced when first transistor 4 is switched into a conductive state. Second terminal contact 2b is situated on plate-shaped conductor 8. In this way, the circuit from FIG. 1 is realized.

In this way, for example when second transistor 7 is switched into a low-ohmic state, a direct connection is produced between first terminal contact 2a and second terminal contact 2b. If second transistor 7 is switched into a high-ohmic state, there is then a flow of current via second terminal contact 2b, through first transistor 4, through energy storage unit 3, to first terminal contact 2a.

FIGS. 10 and 11 show an exemplary embodiment of a prismatic cell. Here, transistors 4, 7 are attached, as bare dies, directly on the metallic contact surfaces of the cell (e.g., by soldering, gluing, sintering). The ASIC is also placed directly on the cell and contacts the MOSFETs (e.g., via bonding connections). Temperature sensor 5c is preferably also integrated on the ASIC. A copper clip contacts the two MOSFETs and provides the external contact, preferably a negative pole. The exemplary embodiment illustrates the low constructive space required and the simple construction of the integrated battery switch. Comparable integration into cylindrical and pouch cells is also advantageous.

The described specific embodiments disclose an electronic connection of transistors 4, 7, of battery cell 1, and of an application-specific integrated circuit for the direct controlling of transistors 4, 7. Additional sensors (e.g., temperature sensor, monitoring of cell current and cell voltage) are suitable for detecting the cell status of battery cell 1. This connection realizes numerous electrical functions at the cell level autonomously, without the intervention of higher-order rules (e.g., BMS).

According to the present invention, it is thus achieved that accurate information at the cell level is available concerning the state of each individual battery cell (SOC, SOH, SOF). In addition, an optimal, individual operation of each individual battery cell at the optimal operating point can take place, as a function of SOC, SOH, SOF, temperature, power requirements, etc., in charge and discharge operation. Some of the above-named functions (balancing, safety circuit, PulsedCharging, . . . ) can be realized only with individual switches for each battery cell. In other cases, the integrated switch reduces the complexity/overhead of external controlling systems and electronics (e.g., of the battery management system BMS). A solution is thus enabled for the "controlling" at the cell level of the outputting and receiving of charge as a function of SOC, SOH, SOF, cycle number, temperature, cell impedance, etc. In this way, the possibility is achieved of a significantly improved cycle strength (through operation at the optimal operating point) and range (through optimal exploitation of the available capacity and optimal charging). In this way, the use of the integrated battery switch created by battery cell 1, while the battery remains the same, brings about an increase in the range and the prolongation of the lifespan of an electric vehicle. In addition, there is a realization of electronic safety of each individual battery cell, including a fast discharge function.

In addition to the above disclosure, reference is made explicitly to the disclosure of FIGS. 1 through 11.

What is claimed is:

1. A battery cell, comprising:
a first terminal contact;
a second terminal contact;
an energy storage unit;
a first transistor;
a sensor system configured to acquire a state parameter of the battery cell; and
a control circuit; and
a second transistor connected between the first terminal contact and the second terminal contact, parallel to the energy storage unit;
wherein the control circuit is configured to control a switching process of the second transistor,
wherein the second transistor is a thin-film MOSFET transistor,
wherein the control circuit is configured to switch both the first transistor and the second transistor into a conductive state simultaneously, and
wherein:
a first pole of the energy storage unit is coupled to the first terminal contact, and a second pole of the energy storage unit is coupled to the second terminal contact,
the first transistor is connected between the first terminal contact and the second terminal contact in series with the energy storage unit, and
the control circuit is configured to control a switching process of the first transistor based on the acquired state parameter to control a charge current or a discharge current of the energy storage unit,
wherein the first transistor and the second transistor are situated on an external surface of the energy storage unit.

2. The battery cell according to claim 1, wherein the sensor system includes a voltage sensor and/or a current sensor and/or a temperature sensor.

3. The battery cell as recited in claim 1, wherein the first transistor is a thin-film MOSFET transistor.

4. The battery cell as recited in claim 1, wherein the control circuit is configured to control the switching process of the first transistor for controlling the charge current or the discharge current through a pulsed switching of the first transistor or through an operation of the first transistor in a resistance operating mode.

5. The battery cell as recited in claim 1, wherein the control circuit is configured to control the switching process of the first transistor for controlling the charge current or the discharge current in such a way that a cell balancing is carried out.

6. The battery cell as recited in claim 1, wherein the control circuit is configured to ascertain a charge state of the energy storage unit, and/or a state of aging of the energy storage unit, and/or a functional state of the energy storage unit.

7. A battery cell, comprising:
a first terminal contact;

a second terminal contact;
an energy storage unit;
a first transistor;
a sensor system configured to acquire a state parameter of the battery cell; and
a control circuit;
wherein:
- a first pole of the energy storage unit is coupled to the first terminal contact, and a second pole of the energy storage unit is coupled to the second terminal contact,
- the first transistor is connected between the first terminal contact and the second terminal contact in series with the energy storage unit, and
- the control circuit is configured to control a switching process of the first transistor based on the acquired state parameter to control a charge current or a discharge current of the energy storage unit,
- wherein the first transistor is situated on an external surface of the energy storage unit, a first contact surface of the first transistor lies on the second pole of the energy storage unit, a plate-shaped conductor lies on a second contact surface of the first transistor that is oriented away from the external surface of the energy storage unit, and the plate-shaped conductor is electrically connected to the second terminal contact.

8. The battery cell as recited in claim 7, further comprising:
- a further transistor situated on the external surface of the energy storage unit, a first contact surface of the further transistor lying on the first pole of the energy storage unit, the plate-shaped conductor further lying on a second contact surface of the further transistor that is oriented away from the external surface of the energy storage unit.

* * * * *